United States Patent [19]

Shimokawa et al.

[11] Patent Number: 5,432,039
[45] Date of Patent: Jul. 11, 1995

[54] RADIATION SENSITIVE QUINONE DIAZIDE AND RESIN COMPOSITION FOR MICROLENS

[75] Inventors: Tsutomu Shimokawa; Atsufumi Shimada; Masayuki Endo; Nobuo Bessho, all of Yokohama, Japan

[73] Assignee: Japan Synthetic Rubber Co., Ltd., Tokyo, Japan

[21] Appl. No.: 139,825

[22] Filed: Oct. 22, 1993

[30] Foreign Application Priority Data

Oct. 22, 1992 [JP] Japan .................................. 4-284585

[51] Int. Cl.$^6$ .............................................. G03F 7/023
[52] U.S. Cl. .................................. 430/191; 430/165; 430/192
[58] Field of Search ......................... 430/191, 192, 193

[56] References Cited

U.S. PATENT DOCUMENTS 5,183,722  2/1993  Tsutsumi et al. .................... 430/191

FOREIGN PATENT DOCUMENTS 0133216  2/1985  European Pat. Off. .
0407086  1/1991  European Pat. Off. .
0425418  5/1991  European Pat. Off. .
0520626  12/1992  European Pat. Off. .
3-223702  10/1991  Japan .
5-158232  6/1993  Japan .

OTHER PUBLICATIONS

Database WPI, Derwent Publications, AN 92-205553, JP-A-4136858, May 11, 1992.

Primary Examiner—Charles L. Bowers, Jr.
Assistant Examiner—Christopher G. Young
Attorney, Agent, or Firm—Oblon, Spivak, McClelland, Maier & Neustadt

[57] ABSTRACT

A radiation sensitive resin composition for microlens comprising (a) an alkali-soluble resin, (b) a 1,2-quinonediazide compound, (c) a compound having at least 2 epoxy groups in the molecule, (d) a melamine and (e) a trihalomethyltriazine or an onium salt, which composition exhibits high sensitivity, high resolution and high yield of residual film thickness in the formation of a lens pattern and is small in dependency on heating conditions in the preparation of a microlens.

15 Claims, 1 Drawing Sheet

F I G. 1
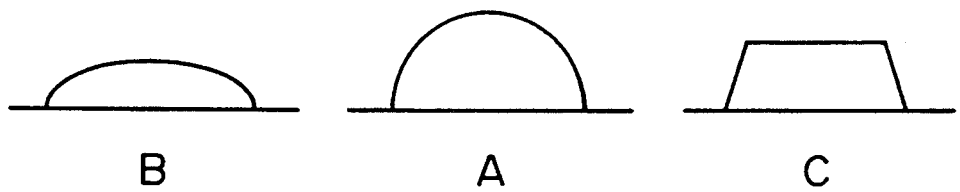

RADIATION SENSITIVE QUINONE DIAZIDE AND RESIN COMPOSITION FOR MICROLENS

BACKGROUND OF THE INVENTION

This invention relates to a radiation sensitive resin composition for microlens. Particularly, it relates to a positive type radiation sensitive resin composition suitable to the preparation of microlens using radiations such as ultraviolet ray, far ultraviolet ray, X-ray, electron beam, molecular beam, γ-ray, synchrotron radiation, proton beam and the like. More particularly, it relates to a positive type radiation sensitive resin composition for microlens suitable to the preparation of a lens array composed of fine optical lenses arranged regularly.

Microlenses having a lens diameter of about 5-20 μm or microlens array composed of microlenses arranged regularly are applied to an image-forming optical system of on-chip color filter such as facsimile, electron copying machine, charged coupled device and the like.

Among the above-mentioned microlenses (microlens arrays), refractive index distributed cylindrical lens prepared by an ion-exchange method and convex microlenses prepared from photosensitive glass have been put to practical use.

However, the microlenses which are now practically used have such problems that the production cost therefor is high because the processes for producing them are all complicated and that it is impossible to unify the microlenses with other parts in the course of producing the lenses because of limitations due to production processes. For example, such problems are present that distributed refractive index type flat microlenses prepared by an ion-exchange method are required to be subjected to surface polishing, and convex microlenses prepared from photosensitive glass cannot be molded into other forms than the predetermined form. Hence, there has recently been tried a method comprising forming a lens pattern by melting a positive type photoresist which is used in semiconductor integrated circuit production. The resist pattern was heated to make it round shape for utilizing a microlens or for transferring that shape to a under layer by dry etching to obtain desired curvature radius.

When microlenses are, however, prepared by the above-mentioned methods, such problems are caused that the heat resistance, solvent resistance, transparency and adhesion to substrate of the lens are unsatisfactory though the sensitivity, resolution and refractive index are satisfactory. Moreover, when microlenses are prepared according to the method mentioned hereinafter, there are such problems that the process for preparing the microlenes is complicated and the properties of the surfaces of microlenses are changed by dry-etching.

SUMMARY OF THE INVENTION

An object of this invention is to provide a radiation sensitive resin composition for microlenses freed from the above-mentioned problems.

Another object of this invention is to provide a radiation sensitive resin composition for microlenses which exhibits such excellent characteristics as high sensitivity, high resolution and high yield of residual film thickness when lens patterns are formed, also exhibits a small dependency on the conditions for heat-treatment and can give microlenses having a high refractive index and excellent heat distortion resistance of submicron order, excellent solvent resistance, excellent transparency and excellent adhesion to substrate.

Other objects and advantages of this invention will become apparent from the following description.

According to this invention, there is provided a radiation sensitive resin composition which comprises:
(a) an alkali-soluble resin,
(b) a 1,2-quinonediazide compound,
(c) a compound having at least two epoxy groups in the molecule,
(d) a melamine represented by formula (I):

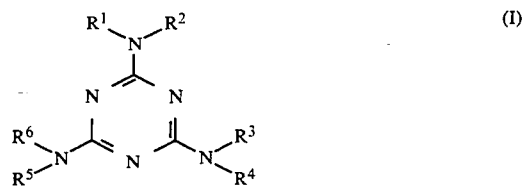

wherein $R^1$ - $R^6$ are the same or different, and each thereof represents a hydrogen atom or a —$CH_2OR$ group in which R represents a hydrogen atom or an alkyl group having 1 to 6 carbon atoms,
(e) a trihalomethyltriazine represented by formula (II):

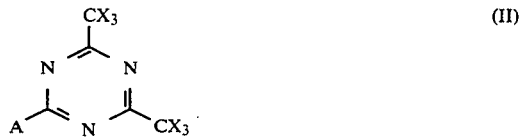

wherein X represents a halogen atom and A represents $CX_3$ or a group represented by one of the following formulas:

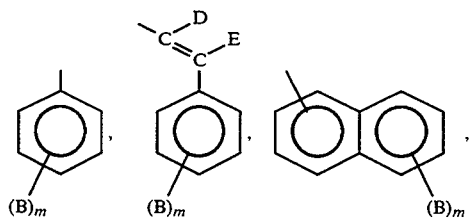

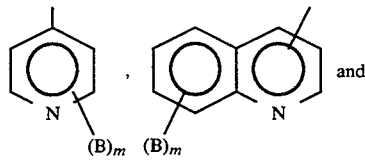

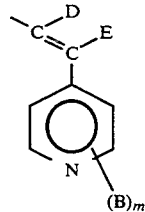

in which each of B, D and E represents a hydrogen atom, an alkyl group having 1 to 10 carbon atoms, an aryl group having 6 to 10 carbon atoms, an alkoxy group having 1 to 10 carbon atoms, an aryloxy group having 6 to 10 carbon atoms, a thioalkyl group having 1 to 10 carbon atoms, a thioaryl group having 6 to 10 carbon atoms, a halogen atom, a cyano group, a nitro group, a tertiary amino group having an alkyl group having 1 to 10 carbon atoms, a carboxyl group, a hydroxyl group, a ketoalkyl group having 1 to 10 carbon atoms, a ketoaryl group, an alkoxycarbonyl group having 1-20 carbon atoms, or an alkylcarbonyloxy group having 1-20 carbon atoms, and m represents an integer of 1 to 5, or an onium salt represented by formula (III) and functioning as a photo-acid-generating agent:

$$(A)_n Z^+ Y^- \tag{III}$$

wherein A is as defined above, Z represents sulfur or iodine, Y represents $BF_4$, $PF_6$, $SbF_6$, $AsF_6$, p-toluenesulfonate, trifluoromethane-sulfonate or trifluoroacetate, and n represents 2 or 3.

BRIEF DESCRIPTION OF THE DRAWINGS

FIG. 1 shows diagrammatic views of cross-sectional shapes of resist patterns.

DETAILED DESCRIPTION OF THE INVENTION

An explanation is made of each constituent of this invention below.

(a) Alkali-soluble Resin

The alkali-soluble resin used in this invention is preferably a homopolymer of an alkali-soluble, radically polymerizable monomer having a phenolic hydroxyl group or a carboxyl group or a copolymer of said alkali-soluble, radically polymerizable monomer with other radically polymerizable monomers.

The alkali-soluble, radically polymerizable monomers are preferably o-, m- and p-hydroxystyrenes; alkyl-, alkoxy-, halogeno-, haloalkyl-, nitro-, cyano-, amido-, ester- and carboxyl-substituted o-, m- and p-hydroxystyrenes; polyhydroxyvinylphenols such as vinylhydroquinone, 5-vinylpyrogallol, 6-vinylpyrogallol, 1-vinylphloroglucinol and the like; o-, m- and p-vinylbenzoic acids; alkyl-, alkoxy-, halogeno-, nitro-, cyano-, amido- and ester-substituted o-, m- and p-vinylbenzoic acids; (meth)acrylic acids; α-haloalkyl-, α-alkoxy-, α-halogeno-, α-nitro- and α-cyano-substituted (meth)acrylic acids; unsaturated dicarboxylic acids such as maleic acid, maleic anhydride, fumaric acid, fumaric anhydride, citraconic acid, mesaconic acid, itaconic acid, 1,4-cyclohexenedicarboxylic acid and the like; and methyl, ethyl, propyl, i-propyl, n-butyl, sec-butyl, tert-butyl, phenyl, o-toluyl, m-toluyl and p-toluyl half esters and amides of the unsaturated dicarboxylic acids. These monomers may be used alone or in combination of two or more.

Said other radically polymerizable monomers include, for example, styrene; α-, o-, m- and p-alkyl-, alkoxy-, halogeno-, haloalkyl-, nitro-, cyano-, amido- and ester-substituted styrenes; olefins such as butadiene, isoprene, neoprene and the like; methyl, ethyl, n-propyl, i-propyl, n-butyl, sec-butyl, tert-butyl, pentyl, neopentyl, isoamylhexyl, cyclohexyl, adamantyl, allyl, propargyl, phenyl, naphthyl, anthracenyl, anthraquinonyl, piperonyl, salicyl, cyclohexyl, benzyl, phenecyl, cresyl, glycidyl, 1,1,1-trifluoroethyl, perfluoroethyl, perfluoro-n-propyl, perfluoro-i-propyl, triphenylmethyl, dicyclopentanyl, cumyl, 3-(N,N-dimethylamino)propyl, 3-(N,N-dimethyl-amino)ethyl, furyl and furfuryl esters of (meth)acrylic acids; (meth)acrylic anilides; (meth)acrylic amides; N,N-dimethyl, N,N-diethyl, N,N-dipropyl, N,N-diisopropyl and anthranyl amides; acrylonitrile; acrolein; methacrylonitrile; vinyl chloride; vinylidene chloride; vinyl fluoride; vinylidene fluoride; N-vinylpyrrolidone; vinylpyridine; vinyl acetate; N-phenylmaleinimide; N-(4-hydroxyphenyl)maleinimide; N-methacryloylphthalimide; N-acryloylphthalimide; and the like. These compounds may be used alone or in combination of two or more.

Among these monomers, particularly preferable are o-, m- and p-hydroxystyrenes; alkyl- and alkoxy-substituted o-, m- and p-hydroxystyrenes; (meth)acrylic acids; α-haloalkyl-, α-alkoxy-, α-halogeno-, α-nitro- and α-cyano-substituted (meth)acrylic acids; styrene; α-, o-, m- and p-alkyl, -alkoxy-, -halogeno- and -haloalkyl-substituted styrenes; butadiene; isoprene; methyl, ethyl, n-propyl, n-butyl, glycidyl and dicyclopentanyl (meth)acrylates in view of the sensitivity during patterning, resolution, yield of residual film thickness after development, refractive index after formation of microlens, heat distortion resistance of submicron order, solvent resistance, transparency, adhesion to substrate, storage stability of solution and the like.

The proportion of said other radically polymerizable monomers copolymerized is preferably 0–30% by weight, particularly preferably 5–20% by weight, based on the total weight of the phenolic hydroxyl group-containing radically polymerizable monomer and said other radically polymerizable monomers or preferably 0–90% by weight, particularly preferably 10–80% by weight, based on the total weight of the carboxyl group-containing radically polymerizable monomer and said other radically polymerizable monomers. When the proportion of said other radically polymerizable monomers copolymerized exceeds the above-mentioned proportion to the phenolic hydroxyl group-containing or carboxyl group-containing radically polymerizable monomer, alkali-development becomes very difficult in some cases.

The above-mentioned alkali-soluble resins may be used alone or in admixture of two or more. The alkali-soluble resins may be synthesized by a method comprising previously introducing a protective group into the carboxyl or phenolic hydroxyl group before polymerization and removing the protective group after polymerization to impart alkali-solubility to the resin. In addition, the transparency in the visible light region and softening point may be varied by hydrogenating the resins, or a mixture of the alkali-soluble resin with a condensation resin, a typical example of which is a novolak resin, may be used. Moreover, the melting temperature of microlens can be controlled by regulating the molecular weight of the resin.

The solvent which may be used in the preparation of the alkali-soluble resin includes, for example, alcohols such as methanol, ethanol, propanol, butanol and the like; cyclic ethers such as tetrahydrofuran, dioxane and the like; aromatic hydrocarbons such as benzene, toluene, xylene and the like; non-protonic polar solvents such as dimethylformamide, N-methylpyrrolidone and the like; acetates such as ethyl acetate, butyl acetate and the like; glycol ethers such as diethylene glycol dimethyl ether and the like; Cellosolve acetate esters such as methyl Cellosolve and the like; etc. The amount of the solvent used is preferably 20–1,000 parts by weight per 100 parts by weight of the starting reactants.

The polymerization initiator which may be used includes, for example, azo compounds such as 2,2'- azobisisobutyronitrile, 2,2'-azobis(2,4-methylvaleronitrile), 2,2'-azobis(4-methoxy-2,4-dimethylvaleronitrile) and the like; organic peroxides such as benzoyl peroxide, lauroyl peroxide, tert-butyl peroxypivalate, 1,1-bis(tert-butylperoxy)cyclohexane and the like; and hydrogen peroxide. When hydrogen peroxide is used as the initiator, it may be combined with a reducing agent to form a redox initiator.

The polystyrene-reduced weight average molecular weight of the alkali-soluble resin used in this invention is preferably 2,000–100,000, more preferably 3,000–50,000 and most preferably 5,000–30,000. When the weight average molecular weight is less than 2,000, the pattern form, resolution and heat resistance tend to become inferior and when it exceeds 100,000 the pattern form and developability tend to become inferior, and in particular, the tendency of sensitivity and molten form being deteriorated becomes great.

(b) 1,2-Quinonediazide Compound

The 1,2-quinonediazide compound used in the composition of this invention includes, for example, 1,2-naphthoquinonediazidesulfonic acid esters of trihydroxybenzophenone such as 2,3,4-trihydroxybenzophenone-1,2-naphthoquinonediazide-4-sulfonic acid ester, 2,3,4-trihydroxybenzophenone-1,2-naphthoquinonediazide-5-sulfonic acid ester, 2,4,6-trihydroxybenzophenone-1,2-naphthoquinonediazide-4-sulfonic acid ester, 2,4,6-trihydroxybenzophenone-1,2-naphthoquinonediazide-5-sulfonic acid ester and the like; 1,2-naphthoquinonediazidesulfonic acid esters of tetrahydroxybenzophenone such as 2,2',4,4'-tetrahydroxybenzophenone-1,2-naphthoquinonedizaide-4-sulfonic acid ester, 2,2',4,4'-tetrahydroxybenzophenone-1,2-naphthoquinonediazide-5-sulfonic acid ester, 2,3,4,3'-tetrahydroxybenzophenone-1,2-napthtoquinonediazide-4-sulfonic acid ester, 2,3,4,3'-tetrahydroxybenzophenone-1,2-naphthoquinonediazide-5-sulfonic acid ester, 2,3,4,4'-tetrahydroxybenzophenone-1,2-naphthoquinonediazide-4-sulfonic acid ester, 2,3,4,4'-tetrahydroxybenzophenone-1,2-naphthoquinonediazide-5-sulfonic acid ester, 2,3,4,2'-tetrahydroxy-4'-methylbenzophenone-1,2-naphthoquinonediazide-4-sulfonic acid ester, 2,3,4,2'-tetrahydroxy-4'-methylbenzophenone-1,2-naphthoquinonediazide-5-sulfonic acid ester, 2,3,4,4'-tetrahydroxy-3'-methoxybenzophenone-1,2-napthoquinonediazide-4-sulfonic acid ester, 2,3,4,4'-tetrahydroxy-3'-methoxybenzophenone-1,2-naphthoquinonediazide-5-sulfonic acid ester and the like; and 1,2-naphthoquinonediazidesulfonic acid esters of pentahydroxyphenylbenzophenone such as 2,3,4,2',6'-pentahydroxybenzophenone-1,2-naphthoquinonediazide-4-sulfonic acid ester, 2,3,4,2',6'-pentahydroxybenzophenone-1,2-napthoquinonediazide-5-sulfonic acid ester and the like; 1,2-naphthoquinonediazidesulfonic acid esters of hexahydroxybenzophenone such as 2,4,6,3',4',5'-hexahydroxybenzophenone-1,2-naphthoquinonediazide-4-sulfonic acid ester, 2,4,6,3',4',5'-hexahydroxybenzophenone-1,2-naphthoquinonediazide-5-sulfonic acid ester, 3,4,5,3',4',5'-hexahydroxybenzophenone-1,2-naphthoquinonediazide-4-sulfonic acid ester, 3,4,5,3',4',5'-hexahydroxybenzophenone-1,2-naphthoquinonediazide-5-sulfonic acid ester and the like; and 1,2-naphthoquinonediazidesulfonates of (polyhydroxyphenyl)alkanes such as bis(2,4-dihydroxyphenyl)methane-1,2-naphthoquinonediazide-4-sulfonic acid ester, bis(2,4-dihydroxyphenyl)methane-1,2-naphthoquinonediazide-5-sulfonic acid ester, bis(p-hydroxyphenyl)methane-1,2-naphthoquinonediazide-4-sulfonic acid ester, bis(p-hydroxyphenyl)methane-1,2-naphthoquinonediazide-5-sulfonic acid ester, tri(p-hydroxyphenyl)methane-1,2-naphthoquinonediazide-4-sulfonic acid ester, tri(p-hydroxyphenyl)methane-1,2-naphthoquinonediazide-5-sulfonic acid ester, 1,1,1-tri(p-hydroxyphenyl)ethane-1,2-naphthoquinonediazide-4-sulfonic acid ester, 1,1,1-tri(p-hydroxyphenyl)ethane-1,2-naphthoquinonediazide-5-sulfonic acid ester, bis-(2,3,4-trihydroxyphenyl)methane-1,2-naphthoquinonediazide-4-sulfonic acid ester, bis(2,3,4-trihydroxyphenyl)methane-1,2-naphthoquinonediazide-5-sulfonic acid ester, 2,2-bis(2,3,4-dihydroxyphenyl)propane-1,2-naphthoquinonediazide-4-sulfonic acid ester, 2,2-bis(2,3,4-dihydroxyphenyl)propane-1,2-naphthoquinonediazide-5-sulfonic acid ester, 1,1,3-tris(2,5-dimethyl-4-hydroxyphenyl)-3-phenylpropane-1,2-naphthoquinonediazide-4-sulfonic acid ester, 1,1,3-tris(2,5-dimethyl-4-hydroxyphenyl)-3-phenylpropane-1,2-naphthoquinonediazide-5-sulfonic acid ester, 4,4'-[1-[4-[1-[4-hydroxyphenyl]-1-methylethyl]phenyl]ethylidene]bisphenol-1,2-naphthoquinonediazide-4-sulfonic acid ester, 4,4'-[1-[4-[1-[4-hydroxyphenyl]-1-methylethyl]phenyl]ethylidene]-bisphenol-1,2-naphthoquinonediazide-5-sulfonic acid ester, bis(2,5-dimethyl-4-hydroxyphenyl)-2-hydroxyphenylmethane-1,2-naphthoquinonediazide-5-sulfonic acid ester, bis(2,5-dimethyl-4-hydroxyphenyl)-2-hydroxyphenylmethane-1,2-naphthoquinonediazide-4-sulfonic acid ester, 3,3,3',3'-tetramethyl-1,1'-spiroindene-5,6,7,5',5',7'-hexanol-1,2-naphthoquinonediazide-5-sulfonic acid ester, 3,3,3',3'-tetramethyl-1,1'-spiroindene-5,6,7,5',6',7'-hexanol-1,2-naphthoquinonediazide-4-sulfonic acid ester, 2,2,4-trimethyl-7,2', 4'-trihydroxyflavan-1,2-naphthoquinonediazide-5-sulfonate, 2,2,4-trimethyl-7,2',4'-trihydroxyflavan-1,2-naphthoquinonediazide- 4-sulfonic acid ester and the like.

In addition to these compounds, the 1,2-quinonediazide compounds can be used that are mentioned in J. Kosar, "Light-Sensitive Systems", 339–352 (1965), John Wiley & Sons (New York), and W. S. De Fores, "Photoresist", 50 (1975), McGraw-Hill, Inc. (New York). These 1,2-quinonediazide compounds may be used alone or in combination of two or more. The 1,2-quinonediazide compound may partly or wholly be in the form of a condensate with the above-mentioned alkali-soluble resin (a).

Among these 1,2-quinonediazide compounds, particularly preferable are 1,1,3-tris(2,5-dimethyl-4-hydroxyphenyl)-3-phenylpropane-1,2-naphthoquinonediazide-5-sulfonic acid ester, 1,1,3-tris(2,5-dimethyl-4-hydroxyphenyl)-3-phenylpropane-1,2-naphthoquinonediazide-4-sulfonic acid ester, 4,4'-[1-[4-[1-[4-hydroxyphenyl]-1-methylethyl]phenyl]ethylidene]-bisphenol-1,2-naphthoquinonediazide-4-sulfonic acid ester, 4,4'-[1-[4-[1-[4-hydroxyphenyl]-1-methylethyl]phenyl]ethylidene]bisphenol-1,2-naphthoquinonediazide-5-sulfonic acid ester, 2,2,4-trimethyl-7,2',4'-trihydroxyflavan-1,2-naphthoquinonediazide-5-sulfonic acid ester, 2,2,4-trimethyl-7,2',4'-trihydroxyflavan-1,2-naphthoquinonediazide-4-sulfonic acid ester, 1,1,1-tri(p-hydroxyphenyl)ethane-1,2-naphthoquinonediazide-4-sulfonic acid ester and 1,1,1-tri(p-hydroxyphenyl)ethane-1,2-naphthoquinonediazide-5-sulfonic acid ester in view of their effects on preventing the alkali-soluble resin from being dissolved or transparency in a visible region after photobleaching.

The amount of the 1,2-quinonediazide compound added is preferably 5–100 parts by weight, more preferably 10–50 parts by weight, per 100 parts by weight of the alkali-soluble resin (a). When the amount is less than 5 parts by weight, the amount of carboxylic acid produced by a radiation absorbed by the 1,2-quinonediazide compound is small, so that the patterning is difficult, and in addition thereto, the amount of carboxylic acid contributing to the reaction with an epoxy resin stated hereinafter becomes small, so that the heat resistance and solvent resistance of the microlens formed becomes unsatisfactory. On the other hand, when the amount exceeds 100 parts by weight, it becomes difficult to decompose all the 1,2-quinonediazide compound added by a short-time irradiation with a radiation and hence the development with an aqueous alkaline solution becomes difficult in some cases.

The composition of this invention may have compounded therewith a sensitizer for the 1,2-quinonediazide compound (b) for the main purpose of enhancing the sensitivity. The sensitizer includes, for example, 2H-pyrido-(3,2-b)-(1,4)-oxazin-3-(4H)-ones, 10H-pyrido-(3,2-b)-(1,4)-benzothiazines, urazoles, hydantoins, barbituric acids, glycine anhydrides, 1-hydroxybenzotriazoles, alloxanic acids, maleimides and the like. The amount of the sensitizer compounded is preferably not more than 100 parts by weight, more preferably 4–60 parts by weight, per 100 parts by weight of the 1,2-quinonediazide compound.

(c) Compound Having at Least Two Epoxy Groups in the Molecule

The compound having at least two epoxy groups in the molecule includes, for example, commercially available bisphenol A type epoxy resins such as Epikote 1001, 1002, 1003, 1004, 1007, 1009, 1010 and 828 (trade name of Yuka Shell Epoxy k. K.) and the like; commercially available bisphenol F type epoxy resins such as Epikote 807 (trade name of Yuka Shell Epoxy K. K.) and the like; commercially available phenol novolak type epoxy resins such as Epikote 152 and 154 (trade name of Yuka Shell Epoxy K. K.), EPPN 201 and 202 (trade name of NIPPON KAYAKU CO., LTD.) and the like; commercially available cresol novolak type epoxy resins such as EOCN-102, 103S, 104S, 1020, 1025 and 1027 (trade name of NIPPON KAYAKU CO., LTD.), Epikote 180S75 (trade name of Yuka Shell Epoxy K. K.) and the like; commercially available alicyclic epoxy resins such as CY-175, 177 and 179 (trade name of CIBA-GEIGY A.G.), ERL-4234, 4299, 4221, 4206 (trade name of U.C.C.), Shodain 509 (trade name of Showa Denko K. K.), Araldite CY-182, 192 and 184 (trade name of CIBA-GEIGY A.G.), Epikron 200 and 400 (trade name of DAINIPPON INK & CHEMICALS, INC.), Epikote 871 and 872 (Yuka Shell Epoxy K. K.), ED-5661 and 5662 (trade name of Celanese Coating K. K.) and the like; commercially available aliphatic polyglycidyl ethers such as Epolite 100 MF (trade name of Kyoei Yushi Kagaku K. K.), Epiol TMP (trade name of Nihon Yushi K. K.) and the like.

Among these compounds, preferable are bisphenol A type epoxy resins, bisphenol F type epoxy resins, phenol novolak type epoxy resins, cresol novolak type epoxy resins and aliphatic polyglycidyl ethers in view of discoloration after heat treatment.

Many of the epoxy compounds are of high molecular weight; however, the molecular weight of the epoxy compound used in this invention is not critical, and such low molecular weight compounds as glycidyl ethers of bisphenol A and bisphenol F may be used.

The amount of the epoxy compound added is preferably 1–100 parts by weight, more preferably 5–50 parts by weight, per 100 parts by weight of the alkali-soluble resin (a). When the amount is less than 1 part by weight, there is a problem that reaction with the carboxylic acid formed by photolysis of the 1,2-quinonediazide compound (b) cannot proceed sufficiently, so that the heat resistance and solvent resistance of microlens tend to be lowered. When the amount is more than 100 parts by weight, there is a problem that the softening point of the whole composition becomes low, so that it is difficult to keep the lens shape during heat treatment in the preparation of microlens. Incidentally, the compound having at least two epoxy groups in the molecule per se does not exhibit alkali-solubility; however, it is necessary that in the composition of this invention, the compound exhibits alkali-solubility.

(d) Melamines Represented by Formula (I)

In formula (I), $R^1$ - $R^6$ may be the same as or different from one another and each thereof represents a hydrogen atom or a —$CH_2OR$ group in which R represents a hydrogen atom or an alkyl group having 1–6 carbon atoms. This alkyl group may be of a straight or branched chain.

The melamines represented by formula (I) include, for example, hexamethylolmelamine, hexabutylolmelamine, partially methylolated melamines, alkylated partially methylolated melamines, tetramethylolbenzoguanamine, partially methylolated benzoguanamines, alkylated partially methylolated benzoguanamines and the like.

The amount of the melamine added is preferably 1–100 parts by weight, more preferably 5–10 parts by weight, per 100 parts by weight of the alkali-soluble resin (a). When the amount of the melamine added is less than 1 part by weight, such a problem tends to be caused that it is difficult to control the thermal flow of the system, so that the lens shape cannot be kept during the heat treatment in the preparation of microlens. When the amount of the melamine added exceeds 100 parts by weight, the alkali-solubility of the composition as a whole becomes too high, so that the yield of residual film thickness after development becomes too low.

(e) Trihalomethyltriazine Represented by Formula (II) or Onium Salt Represented by Formula (III)

In formula (II), X represents a halogen and A represents $CX_3$ or a group represented by one of the following formulas:

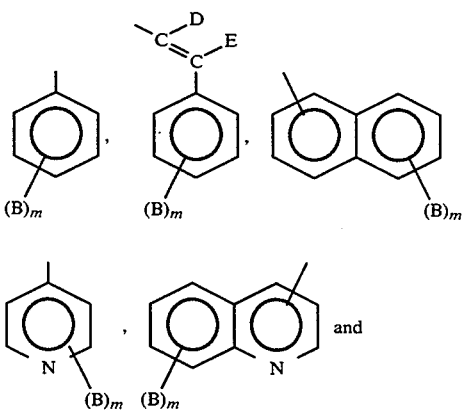

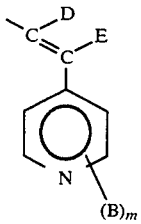

in which each of B, D and E represents a hydrogen atom, an alkyl group having 1-10 carbon atoms, an aryl group having 6-10 carbon atoms, an alkoxy group having 1-10 carbon atoms, an aryloxy group having 6-10 carbon atoms, a thioalkyl group having 1-10 carbon atoms, a thioaryl group having 6-10 carbon atoms, a halogen atom, a cyano group, a nitro group, a tertiary amine group having an alkyl group having 1-10 carbon atoms, a carboxyl group, a hydroxyl group, a ketoalkyl group having 1-10 carbon atoms, a ketoaryl group, an alkoxycarbonyl group having 1-20 carbon atoms or an alkylcarbonyloxy group having 1- 20 cabon atoms; and m represents an integer of 1-5.

The trihalomethyltrizaine represented by formula (II) includes, for example, tris (2,4,6-trichloromethyl)-s-triazine, 2-phenyl-bis(4,6-trichloromethyl)-s-triazine, 2-(4-chlorophenyl)-bis(4,6-trichloromethyl)-s-triazine, 2-(3-chlorophenyl)-bis(4,6-trichloromethyl)-s-triazine, 2-(2-chlorophenyl)-bis(4,6-trichloromethyl)-s-triazine, 2-(4-methoxyphenyl)-bis(4,6-trichloromethyl)-s-triazine, 2-(3-methoxyphenyl)-bis-(4,6-trichloromethyl)-s-triazine, 2-(2-methoxyphenyl)-bis(4,6-trichloromethyl)-s-trizaine, 2-(4-methylthiophenyl)-bis(4,6-trichloromethyl)-s-triazine, 2-(3-methylthiophenyl)-bis(4,6-trichloromethyl)-s-triazine, 2-(2-methylthiophenyl)-bis(4,6-trichloromethyl)-s-triazine, 2-(4-methoxynaphthyl)-bis(4,6-trichloromethyl)-s-triazine, 2-(3-methoxynaphthyl)-bis-(4,6-trichloromethyl)-s-triazine, 2-(2-methoxynaphthyl)-bis(4,6-trichloromethyl)-s-triazine, 2-(4-methoxy-$\beta$-styryl)-bis(4,6-trichloromethyl)-s-triazine, 2-(3-methoxy-$\beta$-styryl)-bis(4,6-tri-chloromethyl)-s-triazine, 2-(2-methoxy-$\beta$-styryl)-bis(4,6-tri-chloromethyl)-s-triazine, 2-(3,4,5-trimethoxy-$\beta$-styryl)-bis-(4,6-trichloromethyl)-s-triazine, 2-(4-methylthio-$\beta$-styryl)-bis(-4,6-trichloromethyl)-s-triazine, 2-(3-methylthio-$\beta$styryl)-bis(4,6-trichloromethyl)-s-triazine, 2-(2-methylthio-$\beta$-styryl)-bis(4,6-trichloromethyl)-s-triazine and the like.

In formula (III), A is as defined as to formula (II), Z represents sulfur (S) or iodine (I), and Y represents BF$_4$, PF$_6$, SbF$_6$, AsF$_6$, p-toluenesulfonate, trifluoromethanesulfonate or trifluoroacetate and n represents 2 or 3.

The onium salt represented by formula (III) includes, for example, diaryliodonium salts such as diphenyliodonium tetrafluoroborate, diphenyliodonium hexafluorophosphonate, diphenyliodonium hexafluoroarsenate, diphenyliodonium trifluoromethanesulfonate, diphenyliodonium trifluoroacetate, diphenyliodonium p-toluenesulfonate, 4-methoxyphenylphenyliodonium tetrafluoroborate, 4-methoxyphenylphenyliodonium hexafluorophosphonate, 4-methoxyphenylphenyliodonium hexafluoroarsenate, 4-methoxyphenylphenyliodonium trifluoromethanesulfonate, 4-methoxyphenylphenyliodonium trifluoroacetate, 4-methoxyphenylphenyliodonium p-toluenesulfonate, bis(4-tert-butylphenyl)iodonium tetrafluoroborate, bis(4-tert-butylphenyl)iodonium hexafluorophosphonate, bis(4-tert-butylphenyl)iodonium hexafluoroarsenate, bis(4-tert-butyl-phenyl)iodonium trifluoromethanesulfonate, bis(4-tert-butylphenyl)iodonium trifluoroacetate, bis(4-tert-butylphenyl)iodonium p-toluenesulfonate and the like; triarylsulfonium salts such as triphenylsulfonium tetrafluoroborate, triphenylsulfonium hexafluorophosphonate, triphenylsulfonium hexafluoroarsenate, triphenylsulfonium trifluoromethanesulfonate, triphenylsulfonium trifluoroacetate, triphenylsulfonium p-toluenesulfonate, 4-methoxyphenyldiphenylsulfonium tetrafluoroborate, 4-methoxyphenyldiphenylsulfonium hexafluorophosphonate, 4-methoxyphenyldiphenylsulfonium hexafluoroarsenate, 4-methoxyphenyldiphenylsulfonium trifluoromethanesulfonate, 4-methoxyphenyldiphenylsulfonium trifluoroacetate, 4-methoxyphenyldiphenylsulfonium p-toluenesulfonate, 4-phenylthiophenyldiphenyl tetrafluoroborate, 4-phenylthiophenyldiphenyl hexafluorophosphonate, 4-phenylthiophenyl-diphenyl hexafluoroacetate, 4-phenylthiophenyldiphenyl trifluoromethanesulfonate, 4-phenylthiophenyldiphenyl trifluoroacetate, 4-phenylthiophenyldiphenyl p-toluenesulfonate and the like; etc.

Among these compounds, preferable are 2-(3-chlorophenyl)-bis(4,6-trichloromethyl)-s-triazine, 2-(4-methoxyphenyl)-bis(4,6-trichloromethyl)-s-triazine, 2-(4-methylthiophenyl)-bis(4,6-trichloromethyl)-s-triazine, 2-(4-methoxy-$\beta$-styryl)-bis(4,6-trichloromethyl)-s-triazine, 2-(4-methoxynaphthyl)-bis(4,6-trichloromethyl)-s-triazine, diphenyliodonium trifluoroacetate, diphenyliodonium trifluoromethanesulfonate, 4-methoxyphenyl-phenyliodonium trifluoromethanesulfonate, 4-methoxyphenylphenyliodonium trifluoroacetate, triphenylsulfonium trifluoromethanesulfonate, triphenylsulfonium trifluoroacetate, 4-methoxyphenyldiphenylsulfonium trifluoromethanesulfonate, 4-methoxyphenyl-diphenylsulfonium trifluoroacetate, 4-phenylthiophenyldiphenyl trifluoromethanesulfonate, 4-phenylthiophenyldiphenyl trifluoroacetate and the like.

The amount of the compound represented by formula (II) or (III) added is preferably 0.001-10 parts by weight, more preferably 0.01-5 parts by weight, per 100 parts by weight of the alkali-soluble resin (a). When the amount is less than 0.001 part by weight, the amount of the acid generated by post-exposure becomes small, so that the cross-linking of the melamine (d) represented by formula (I) cannot proceed sufficiently during melting and the heat resistance and solvent resistance of microlens tend to be lowered. When the amount is more than 10 parts by weight, the amount of the acid generated by post-exposure is too large, so that there is a tendency that the cross-linking of the melamine (d) represented by formula (I) proceeds before melting, whereby the fluidity of the system is lost and the lens shape is difficult to keep.

The compounds represented by formula (II) or (III) can be used in combination with an appropriate sensitizer. The sensitizer includes, for example, 3-substituted and/or 7-substituted coumarins, flavones, dibenzalacetones, dibenzalcyclohexanes, chalcons, xanthenes, thioxanthenes, porphyrins, acridines and the like.

The composition of this invention may have compounded therewith a surface active agent for improving the coatability, for example, striation and developability of the irradiated portions after the formation of a dried film. The surface active agent includes nonionic surface active agents, for example, polyoxyethylene alkyl ethers such as polyoxyethylene lauryl ether, polyoxyethylene stearyl ether, polyoxyethylene oleyl ether and the like; polyoxyethylene aryl ethers such as polyoxyethylene octylphenyl ether, polyoxyethylene nonylphenyl ether and the like; polyethylene glycol dialkyl esters such as polyethylene glycol dilaurate, polyoxyethylene glycol distearate and the like; fluorine-containing surface active agents, for example, F Top EF 301, 303 and 352 (trade name of Shin Akita Kasei K. K.), Megafac F 171 and 172 and 173 (trade name of DAI-NIPPON INK & CHEMICAL INC.), Fluorad FC 430 and 431 (trade name of Sumitomo 3M Limited), Asahi Guard AG 710, Surflon S-382, SC-101, 102, 103, 104, 105 and 106 (trade names of Asahi Glass Co., Ltd.) and the like; acrylic or methacrylic acid-(co)polymer Polyflow Nos. 57 and 95 (trade name of Kyoeisha Yushikagaku Kogyo K. K.); and the like. The amount of the surface active agent compounded is preferably 2 parts by weight or less, more preferably 1 part by weight or less, per 100 parts by weight of the solids of the composition.

The composition of this invention may have compounded therewith an adhesive for improving the adhesion to a substrate, and may also contain, if necessary, a storage stabilizer, a defoaming agent and the like.

The composition of this invention may be coated on a substrate such as silicon wafer or the like by dissolving in a solvent the above resin, the above 1,2-quinonediazide compound and the above various compounding agents in such amounts that the solids concentration becomes 20–40% by weight, filtering the resulting solution through a filter having a pore diameter of about 0.2 μm and then applying the filtrate to the substrate by spin coating, flow coating, roll coating or the like. The solvent used in this case includes glycol ethers such as ethylene glycol monomethyl ether, ethylene glycol monoethyl ether or the like; ethylene glycol alkyl ether acetates such as methyl Cellosolve acetate, ethyl Cellosolve acetate, and the like; diethylene glycol alkyl ethers such as diethylene glycol monomethyl ether, diethylene glycol monoethyl ether and the like; propylene glycol alkyl ether acetates such as propylene glycol methyl ether acetate, propylene glycol ethyl ether acetate, propylene glycol propyl ether acetate and the like; aromatic hydrocarbons such as toluene, xylene and the like; ketones such as methyl ethyl ketone, cyclohexanone, 2-heptanone, methyl isobutyl ketone and the like; and esters such as methyl 2-hydroxypropionate, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, 3-methyl-3methoxybutyl acetate, 3-methyl-3-methoxybutyl propionate, 3-methyl-3-methoxybutyl butyrate, ethyl acetate, butyl acetate, methyl 3-methoxypropionate, ethyl 3-mthoxypropionate, butyl 3-methoxypropionate and the like. These solvents may be used alone or in admixture of two or more.

If necessary, a high boiling solvent may be added such as benzyl ethyl ether, dihexyl ether, diethylene glycol monomethyl ether, diethylene glycol monoethyl ether, diethylene glycol monobutyl ether, acetonylacetone, isophoron, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl Cellosolve acetate, Carbitol acetate or the like.

The developing solution for the composition of this invention includes aqueous alkali solutions prepared by dissolving in water, for example, an inorganic alkali such as sodium hydroxide, potassium hydroxide, sodium carbonate, sodium silicate, sodium metasilicate, ammonia water or the like; a primary amine such as ethylamine, n-propylamine or the like; a secondary amine such as diethylamine, di-n-propylamine or the like; a tertiary amine such as triethylamine, methyldiethylamine or the like; an alcoholamine such as dimethylethanolamine, triethanolamine or the like; a quaternary ammonium salt such as tetramethylammonium hydroxide, tetraethylammonium hydroxide, choline or the like; or a cyclic amine such as pyrrole, piperidine, 1,8-diazabicyclo-(5.4.0)-7-undecene, 1,5-diazabicyclo-(4.3.0)-5-nonane or the like. Also, the developing solution may contain appropriate amounts of a water-soluble organic solvent, for example, an alcohol such as methanol, ethanol or the like and a surface active agent.

DESCRIPTION OF PREFERRED EMBODIMENTS

Synthesis Examples and Working Examples of this invention are explained below; however, this invention is not limited to the Working Examples. In the Synthesis Examples and Working Examples, % and part are by weight unless otherwise specified.

(1) SYNTHESIS OF ALKALI-SOLUBLE RESIN

Synthesis Example 1

In a 500 ml separable flask equipped with a stirrer, a cooling tube, a nitrogen-introducing tube and thermometer were placed:

| | |
|---|---|
| p-tert-Butoxystyrene | 95 g |
| Styrene | 5 g |
| 2,2'-Azobisisobutyronitrile | 10 g |
| Dioxane | 100 g | and the flask was purged with nitrogen for 30 minutes. The flask was thereafter immersed in an oil bath, and the inner temperature was kept at 80° C., at which polymerization was conducted with stirring for 5 hours to synthesize a resin. To the resin solution obtained was added 60 g of 7.2% aqueous hydrogen chloride solution, and the resulting solution was then heated with stirring at 80° C. for 3 hours to hydrolyze the tert-butoxy group, thereby introducing hydroxyl group into the polymer (this operation is referred to hereinafter as de-protection). The reaction mixture was poured into 10 liters of a methanol/water solution (water:methanol=8:2 by volume), and the slurry obtained was purified by twice reprecipitation from methanol solution into water. The obtained white resin powder was dried in vacuo at 50° C. for overnight [referred to hereinafter as "Resin A (1)"]. Resin A (1) was subjected to measurement of polystyrene-reduced weight average molecular weight (referred to hereinafter as merely the molecular weight) by means of GPC Chromatograph HLC-8020 manufactured by TOHSO CORP. to find that it was $1.01 \times 10^4$ (the molecular weight was measured in the same manner hereinafter).

Synthesis Example 2

The same procedure as in Synthesis Example 1 was repeated, except that the reaction mixture subjected to de-protection of tert-butoxy group was poured into distilled water instead of the methanol/water solution to obtain a resin [referred to hereinafter as "Resin A (2)"]. The molecular weight of Resin A (2) was $0.85 \times 10^4$.

Synthesis Example 3

The same procedure as in Synthesis Example 1 was repeated, except that the following materials were placed in the separable flask:

| | |
|---|---|
| p-tert-Butoxystyrene | 100.0 g |
| 2,2'-Azobisisobutyronitrile | 10.0 g |
| Dioxane | 100.0 g | to synthesize a resin [referred to hereinafter as "Resin A(3)"]. The molecular weight of Resin A (3) was $2.21 \times 10^4$.

Synthesis Example 4

The same procedure as in Synthesis Example 1 was repeated, except that the following materials were placed in the separable flask:

| | |
|---|---|
| p-tert-Butoxystyrene | 95.0 g |
| Phenyl methacrylate | 5.0 g |
| 2,2'-Azobisisobutyronitrile | 10.0 g |
| Dioxane | 100.0 g | to obtain a resin [referred to hereinafter as "Resin A (4)"]. The molecular weight of Resin A (4) was $2.30 \times 10^4$.

Synthesis Example 5

In the same separable flask as in Synthesis Example 1 were placed:

| | |
|---|---|
| Butadiene | 7.5 g |
| Methacrylic acid | 20.0 g |
| Dicyclopentanyl methacrylate | 22.5 g |
| Glycidyl methacrylate | 50.0 g |
| 2,2'-Azobisisobutyronitrile | 4.0 g |
| Diglyme | 250.0 g | and the flask was purged with nitrogen for 30 minutes, after which the flask was immersed in an oil bath. The inner temperature was kept at 80° C., at which polymerization was conducted with stirring for 4 hours to synthesize a resin [referred to hereinafter as "Resin A (5)"]. The solids concentration of Resin A (5) was 30%.

Synthesis Example 6

In the same separable flask as in Synthesis Example 1 were placed:

| | |
|---|---|
| Styrene | 7.5 g |
| Methacrylic acid | 20.0 g |
| Dicyclopentanyl methacrylate | 22.5 g |
| Glycidyl methacrylate | 50.0 g |
| 2,2'-Azobisisobutyronitrile | 4.0 g |
| Diglyme | 250.0 g | and the flask was purged with nitrogen for 30 minutes, after which the flask was immersed in an oil bath. The inner temperature was kept at 80° C., at which polymerization was conducted with stirring for 4 hours to synthesize a resin [referred to hereinafter as "Resin A (6)"]. The solids concentration of Resin A (6) was 30%.

Synthesis Example 7

In a separable flask equipped with a stirrer, a cooling tube, a nitrogen-introducing tube and a thermometer were placed:

| | |
|---|---|
| p-tert-Butoxystyrene | 100.0 g |
| 2,2'-Azobisisobutyronitrile | 2.0 g |
| Dioxane | 100.0 g | and the flask was purged with nitrogen for 30 minutes, after which the flask was immersed in an oil bath. The inner temperature was kept at 80° C., at which polymerization was conducted with stirring for 5 hours and then at 90° C. for 3 hours to synthesize a resin. To the resin was added 60 g of 7.2% aqueous hydrogen chloride solution, and the resulting solution was heated with stirring at 80° C. for 3 hours to be subjected to de-protection of the tert-butoxy group. The reaction mixture was poured into 10 liters of a methanol/water solution, and the slurry obtained was purified by twice reprecipitation from methanol solution into water. The obtained white resin powder was dried in vacuo at 50° C. for overnight [referred to hereinafter as "Resin A (7)"]. The molecular weight of Resin A (7) was $3.45 \times 10^5$.

Synthesis Example 8

In a separable flask equipped with a stirrer, a cooling tube, a nitrogen-introducing tube and a thermometer were placed:

| | |
|---|---|
| p-tert-Butoxystyrene | 100.0 g |
| 2,2'-Azobisisobutyronitrile | 15.0 g |
| Dioxane | 200.0 g | and the flask was purged with nitrogen for 30 minutes, after which the flask was immersed in an oil bath. The inner temperature was kept at 80° C., at which polymerization was conducted with stirring for 3 hours to synthesize a resin. To the resin solution obtained was added 60 g of 7.2% aqueous hydrogen chloride solution, and the resulting solution was stirred at 80° C. for 3 hours to be subjected to de-protection of the tert-butoxy group. The reaction mixture was poured into 10 liters of water, and the slurry obtained was purified by twice reprecipitation from methanol solution into water. The obtained pale yellow resin powder was dried in vacuo at 50° C. for overnight [referred to hereinafter as "Resin A (8)"]. The molecular weight of Resin A (8) was $1.81 \times 10^3$.

(2) WORKING EXAMPLES

Example 1

With 100 parts by weight of Resin A (1) were mixed:

| | |
|---|---|
| Resin A (5) | 40.0 parts (as solids) |
| Compound B (1) (1,2-quinonediazide as shown hereinafter) | 30.0 parts |
| Compound C (1) (epoxy compound as shown hereinafter) | 30.0 parts |
| Compound D (1) (melamine as shown hereinafter) | 10.0 parts |
| Compound E (1) (trihalomethyltriazine compound as shown hereinafter) | 0.5 part | and the mixture was diluted with and dissolved in methyl 3-methoxypropionate (MMP) so that the total solids concentration became 32%, and thereafter, the solution was filtered through a membrane filter having a pore diameter of 0.1 μm to prepare a composition solution. The solution obtained was subjected to patterning according to the method stated in (3)-1 Evaluation Conditions which appears hereinafter and evaluated and observed according to the methods stated in (3)-2 Microlens Performance which appears hereinafter to obtain the results shown in Table 1.

Moreover, this solution was stored at room temperature for 3 months and the same evaluation and observation were conducted to obtain equivalent performance, from which it can be seen that the composition of this invention is excellent in storage stability, too.

Examples 2 to 14

The same procedure as in Example 1 was repeated, except that the resins and compounds shown in Tables 1 and 2 were used to obtain the results shown in Tables 1 and 2.

Comparative Example 1

With 100 parts of Resin A (1) were mixed 30.0 parts of Compound B (1) as shown hereinafter, and the mixture was diluted with and dissolved in methyl 3-methoxypropionate (MMP) so that the total solids concentration became 32%. The solution obtained was filtered through a membrane filter having a pore diameter of 0.1 μm to prepare a composition solution. The composition solution thus obtained was subjected to patterning according to the method stated in (3)-1 Evaluation Conditions which appears hereinafter and evaluated and observed according to the methods stated in (3)-2 Microlens Performance which appears hereinafter to obtain the results shown in Table 2.

Comparative Example 2

With 100 parts by weight of Resin A-(1) were mixed:

| | |
|---|---|
| Compound B (1) (1,2-quinonediazide compound as shown hereinafter) | 30.0 parts |
| Compound C (1) (epoxy compound as shown hereinafter) | 30.0 parts | and the mixture was diluted with and dissolved in methyl 3-methoxypropionate (MMP) so that the total solids concentration became 32%. Thereafter, the solution thus obtained was filtered through a membrane filter having a pore diameter of 0.1 μm to prepare a composition solution. The solution thus obtained was subjected to patterning according to the method stated in (3)-1 Evaluation Conditions which appears hereinafter and evaluated and observed according to the methods stated in (3)-2 Microlens Performance which appears hereinafter to obtain the results shown in Table 2.

Comparative Example 3

With 100 parts of Resin A (1) were mixed:

| | |
|---|---|
| Compound B (1) (1,2-xylenediazide compound as stated hereinafter) | 30.0 parts |
| Compound D (3) (a melamine as stated hereinafter) | 10.0 parts | and the mixture was diluted with and dissolved in methyl 3-methoxypropionate (MMP) so that the total solids concentration became 32%, after which the solution was filtered through a membrane filter having a pore diameter of 0.1 μm to prepare a composition solution. The solution thus obtained was subjected to patterning according to the method stated in (3)-1 Evaluation Conditions which appears hereinafter and evaluated and observed according to the methods stated in (3)-2 Microlens Performance which appears hereinafter. The results obtained are shown in Table 2.

Comparative Example 4

With 100 parts of Resin A (1) were mixed:

| | |
|---|---|
| Compound B (1) (1,2-quinonediazide compound as stated hereinafter) | 30.0 parts |
| Compound D (1) (a melamine as stated hereinafter) | 20.0 parts |
| Compound E (1) (trihalomethyltriazine compound as stated hereinafter) | 0.5 part | and the mixture was diluted with and dissolved in methyl 3-methoxypropionate so that the total solids concentration became 32%, after which the solution was filtered through a membrane filter having a pore diameter of 0.1 μm to prepare a composition solution. The solution thus obtained was subjected to patterning according to the method stated in (3)-1 Evaluation Conditions which appears hereinafter and evaluated and observed according to the methods stated in (3)-2 Microlens Performance which appears hereinafter. The results obtained are shown in Table 2.

Comparative Example 5

With 100 parts of Resin A (1) were mixed:

| | |
|---|---|
| Resin A (5) | 40.0 parts (as solids) |
| Compound B (1) (1,2-quinonediazide as stated hereinafter) | 30.0 parts |
| Compound D (1) (a melamine as stated hereinafter) | 10.0 parts | and the mixture was diluted with and dissolved in methyl 3-methoxypropionate (MMP) so that the total solids concentration became 32%, after which the solution was filtered through a membrane filter having a pore diameter of 0.1 μm to prepare a composition solution. The solution thus obtained was subjected to patterning according to the method stated in (3)-1 Evaluation Conditions and then evaluated and observed according to the methods stated in (3)-2 Microlens Performance. The results obtained are shown in Table 2.

Comparative Example 6

With 100 parts of Resin A (1) were mixed:

| | |
|---|---|
| Compound B (1) (1,2-quinonediazide compound as stated hereinafter) | 30.0 parts |
| Compound C (1) (epoxy compound as stated hereinafter) | 30.0 parts |
| Compound D (1) (a melamine as stated hereinafter) | 10.0 parts |
| Compound E (1) (trihalomethyltriazine compound as stated hereinafter) | 0.5 part | and the mixture was diluted with and dissolved in methyl 3-methoxypropionate (MMP) so that the total solids concentration became 32%, after which the solution was filtered through a membrane filter having a pore diameter of 0.1 μm to prepare a composition solution. The solution thus obtained was subjected to patterning according to the method stated in (3)-1 Evaluation Conditions and then evaluated and observed according to the methods stated in (3)-2 Microlens Performance. The results obtained are shown in Table 2.

Comparative Example 7

With 100 parts of Resin A (7) were mixed:

| | |
|---|---|
| Resin A (5) | 40.0 parts |
| Compound B (1) (1,2-quinonediazide compound as stated hereinafter) | 30.0 parts |
| Compound C (1) (epoxy compound as stated | 30.0 parts |

| | |
|---|---|
| Compound D (1) (a melamine as stated hereinafter) | 10.0 parts |
| Compound E (1) (trihalomethyltriazine compound as stated hereinafter) | 0.5 part | and the mixture was diluted with and dissolved in methyl 3-methoxypropionate (MMP) so that the total solids concentration became 32%, after which the solution thus obtained was filtered through a membrane filter having a pore diameter of 0.1 μm to prepare a composition solution. The solution obtained was subjected to patterning according to the method stated in (3)-1 Evaluation Conditions which appears hereinafter and then evaluated and observed according to the methods stated in (3)-2 Microlens Performance which appears hereinafter. The results obtained are shown in Table 2.

Comparative Example 8

With 100 parts of Resin A (8) were mixed:

| | |
|---|---|
| Resin A (5) | 40.0 parts (as solids) |
| Compound B (1) (1,2-quinonediazide as stated hereinafter) | 30.0 parts |
| Compound C (1) (epoxy compound as stated hereinafter) | 10.0 parts |
| Compound D (1) (a melamine as stated hereinafter) | 10.0 parts |
| Compound E (1) (trihalomethyltriazine compound as shown hereinafter) | 0.5 part | and the mixture was diluted with and dissolved in methyl 3-methoxypropionate (MMP) so that the total solids concentration became 32%, after which the solution was filtered through a membrane filter having a pore diameter of 0.1 μm to prepare a composition solution. The solution thus obtained was subjected to patterning according to the method stated in (3)-1 Evaluation Conditions which appears hereinafter and then evaluated and observed according to the methods stated in (3)-2 Microlens Performance which appears hereinafter. The results obtained are shown in Table 2.

(3) MICROLENS PERFORMANCE (3)-1 Evaluation Conditions

The conditions for evaluation of microlens were as follows:

On a 6-inch silicone substrate was spin-coated a microlens material consisting of a resin, compounds and a solvent as stated hereinafter so that the film thickness became 2.5 μm and then prebaked on a hot plate at 70° C. for 3 minutes. Using a stepper [NSR1755i7A manufactured by NIKON CORP. (NA=0.50, λ=365 nm)], the resulting assembly was exposed to light for a varying exposure period, and the exposed assembly was developed with an aqueous tetramethylammonium hydroxide solution having a concentration as shown in Tables 1 and 2 at 25° C. for one minute. The developed assembly was rinsed with water and then dried to form a pattern on a wafer. The patterned wafer thus obtained was irradiated with ultraviolet rays of 365 nm at a light intensity of 10 mJ/cm$^2$ for 60 seconds. Thereafter, the irradiated wafer was heated for 10 minutes on a hot plate at a lens-formable temperature as shown in Tables 1 and 2 to allow the pattern to melt-flow, thereby forming a microlens, after which the performance of the microlens was evaluated as stated below.

(3)-2 Microlens Performance

The following items of microlens performance were evaluated and observed:

Sensitivity: The minimum exposure time necessary to make the space width 0.8 μm at the 10L1S line-and-space pattern after melt-flowing prepared under the above-mentioned evaluation conditions (said exposure time being referred to hereinafter as "optimum exposure time" or "sensitivity").

Resolution: The dimension of the smallest space pattern resolved at the optimum exposure time was determined by means of a scanning type electron microscope.

Developability: The presence or absence of surface unevenness of the line portions and undeveloped space portions (scum) after development was determined by means of a canning type electron microscope. The case in which no scum was found was indicated as ◯ and the case in which scum was found is indicated as X.

Pattern shape: The cross-sectional shape of resist pattern at the optimum exposure time was determined by means of a canning type electron microscope and whether the cross-sectional shape was good or bad was judged according to FIG. 1, in which A is good, B and C are bad.

Transparency: A microlens material was coated on a quartz substrate and irradiated with ultraviolet rays of 365 nm at a light intensity of 10 mJ/cm$^2$ for 60 seconds. This quartz substrate was heated at a temperature in the lens-formable temperature range shown in Tables 1 or 2 for 10 minutes and further at 170° C. for 3 hours, after which the transmittance of light of 400–800 nm was determined by means of a spectrophotometer. The case in which the lowest transmittance exceeds 95% is indicated as ◯ and the case in which the transmittance is 90–95% is indicated as Δ and the case in which the transmittance is less than 90% is indicated as X.

Heat resistance: The substrate after the formation of a pattern according to the method stated in (3)-1 Evaluation Conditions above was heated on a hot plate at 170° C. for 3 hours, and the heat distortion and transparency of a 0.8 μm-10L/1S pattern were determined. As to the heat resistance, the case in which the proportion of the 0.8-μm space after heating to that before heating exceeds 80% is indicated as ◯, the case in which the proportion is 50–80% is indicated as Δ, and the case in which the proportion is less than 50% is indicated as X. As to the transparency, the evaluation is made in the same manner.

Solvent resistance: The substrate having formed thereon a pattern prepared according to the method stated in (3)-1 above was immersed for one minute in acetone (A), ethylene glycol monoethyl ether acetate (E), isopropyl alcohol (I), dimethylsulfoxide (D) or methyl 3-methoxypropionate (M), washed with water and then dried, after which the yield of residual film thickness was determined. The case in which the yield of residual film thickness exceeds 95% is indicated as ◯, the case in which the yield of residual film thickness is 90–95% is indicated as Δ and the case in which the yield of residual film thickness is less than 90% is indicated as X.

Focus Latitude: At the optimum exposure time, the microlens pattern was formed on a silicone wafer in the same manner as in (3)-1 above, except varying focus offset (distance from optimum focal plane) instead of exposure time. The space width of 0.8 μm 10L1S line-and-space pattern was measured by a scanning electron microscope to determine the range of the focus offset which made the space pattern width from 0.78 μm to 0.82 μm (0.8 μm±0.02 μm). The case in which the above range exceeds 2.0 μm is indicated as ◯, the case in which the above range is 2.0-1.0 μm is indicated as Δ, and the case in which the above range is less than 1.0 μm is indicated as X.

TABLE 1

Test results of microlens performance

| Example No. | Amount of resin (part) | Amount of compound B (part) | Amount of compound C (part) | Amount of compound D (part) | Amount of compound E (part) |
|---|---|---|---|---|---|
| 1 | A (1/5) 100/40 | B (1) 30 | C (1) 30 | D (1) 10 | E (1) 0.5 |
| 2 | A (1/5) 100/40 | B (2) 30 | C (1) 30 | D (1) 10 | D (1) 0.5 |
| 3 | A (1/5) 100/40 | B (1) 30 | C (2) 20 | D (1) 10 | E (1) 0.5 |
| 4 | A (1/5) 100/40 | B (1) 30 | C (3) 15 | D (1) 10 | E (1) 0.5 |
| 5 | A (2/5) 100/40 | B (1) 30 | — | D (1) 10 | E (1) 0.05 |
| 6 | A (1/5) 100/40 | B (2) 30 | — | D (1) 10 | E (1) 0.05 |
| 7 | A (3/5) 100/40 | B (1) 30 | C (1) 30 | D (1) 10 | E (1) 0.5 |
| 8 | A (4/5) 100/40 | B (1) 30 | C (1) 30 | D (1) 10 | E (1) 0.5 |
| 9 | A (9/5) 100/40 | B (1) 30 | C (1) 30 | D (1) 10 | E (1) 0.5 |
| 10 | A (1/6) 100/40 | B (1) 30 | C (1) 30 | D (1) 10 | E (1) 0.5 |

| Example No. | Conc. of developer (TMAH %) | Sensitivity (msec) | Resolution (μm) | Refractive index | Developability |
|---|---|---|---|---|---|
| 1 | 1.5 | 600 | 0.56 | 1.64 | ◯ |
| 2 | 1.5 | 650 | 0.54 | 1.64 | ◯ |
| 3 | 1.5 | 500 | 0.56 | 1.60 | ◯ |
| 4 | 2.0 | 650 | 0.54 | 1.65 | ◯ |
| 5 | 1.5 | 600 | 0.56 | 1.64 | ◯ |
| 6 | 1.5 | 650 | 0.54 | 1.64 | ◯ |
| 7 | 1.0 | 550 | 0.56 | 1.65 | ◯ |
| 8 | 1.8 | 650 | 0.56 | 1.65 | ◯ |
| 9 | 1.2 | 500 | 0.58 | 1.63 | ◯ |
| 10 | 1.8 | 650 | 0.54 | 1.65 | ◯ |

| Example No. | Pattern Shape | Transparency | Heat resistance | Solvent resistance A | E | I | D | M |
|---|---|---|---|---|---|---|---|---|
| 1 | ◯ | ◯ | ◯ | ◯ | ◯ | ◯ | ◯ | ◯ |
| 2 | ◯ | ◯ | ◯ | ◯ | ◯ | ◯ | ◯ | ◯ |
| 3 | ◯ | ◯ | ◯ | ◯ | ◯ | ◯ | ◯ | ◯ |
| 4 | ◯ | ◯ | ◯ | ◯ | ◯ | ◯ | ◯ | ◯ |
| 5 | ◯ | ◯ | ◯ | ◯ | ◯ | ◯ | ◯ | ◯ |
| 6 | ◯ | ◯ | ◯ | ◯ | ◯ | ◯ | ◯ | ◯ |
| 7 | ◯ | ◯ | ◯ | ◯ | ◯ | ◯ | ◯ | ◯ |
| 8 | ◯ | ◯ | ◯ | ◯ | ◯ | ◯ | ◯ | ◯ |
| 9 | ◯ | Δ | ◯ | ◯ | ◯ | ◯ | ◯ | ◯ |
| 10 | ◯ | ◯ | ◯ | ◯ | ◯ | ◯ | ◯ | ◯ |

| Example No. | DOF characteristics | Lens formable temperature (°C) |
|---|---|---|
| 1 | ◯ | 130–170 |
| 2 | ◯ | 130–170 |
| 3 | ◯ | 120–160 |
| 4 | ◯ | 140–180 |
| 5 | ◯ | 130–170 |
| 6 | ◯ | 130–170 |
| 7 | ◯ | 130–170 |
| 8 | ◯ | 130–170 |
| 9 | ◯ | 130–170 |
| 10 | ◯ | 130–170 |

Note:
The amounts of resin and compounds are all parts by weight as solids.

TABLE 2

Test results of microlens performance

| Example No. | Amount of resin | Amount of compd. B | Amount of compd. C | Amount of compd. D |
|---|---|---|---|---|
| 11 | A (1/5) 100/40 | B (1) 30 | C (1) 30 | D (2) 10 |
| 12 | A (1/5) 100/40 | B (2) 30 | C (1) 30 | D (1) 10 |
| 13 | A (1/5) 100/40 | B (1) 30 | C (2) 20 | D (1) 10 |
| 14 | A (1/5) 100/40 | B (1) 30 | C (3) 15 | D (1) 10 |
| Comp. Example 1 | A (1) 100 | B (1) 30 | — | — |
| Comp. Example 2 | A (1) 100 | B (1) 30 | C (1) 30 | — |
| Comp. Example 3 | A (1) 100 | B (1) 30 | — | D (3) 20 |
| Comp. Example 4 | A (1) 100 | B (1) 30 | — | D (1) 10 |
| Comp. Example 5 | A (1/5) 100/40 | B (1) 30 | — | D (1) 10 |
| Comp. Example 6 | A (1) 100 | B (1) 30 | C (1) 30 | D (1) 10 |
| Comp. Example 7 | A (7/5) 100/40 | B (1) 30 | C (1) 30 | D (1) 10 |
| Comp. Example 8 | A (8/5) 100/40 | B (1) 30 | C (1) 30 | D (1) 10 |

| Example No. | Amount of compd. E | Conc. of developer (TMAH %) | Sensitivity (msec) | Resolution (μm) |
|---|---|---|---|---|
| 11 | E (1) 0.5 | 1.5 | 600 | 0.56 |
| 12 | E (2) 0.5 | 1.5 | 650 | 0.54 |
| 13 | E (3) 0.5 | 1.5 | 500 | 0.56 |
| 14 | E (4) 0.5 | 2.0 | 650 | 0.54 |
| Comp. Example 1 | — | 2.4 | 600 | 0.54 |
| Comp. Example 2 | — | 1.6 | 550 | 0.56 |
| Comp. Example 3 | — | 1.2 | 500 | 0.56 |
| Comp. Example 4 | E (1) 0.5 | 1.8 | 650 | 0.56 |
| Comp. Example 5 | — | 1.8 | 650 | 0.56 |
| Comp. Example 6 | E (1) 0.5 | 1.8 | 600 | 0.56 |
| Comp. Example 7 | E (1) 0.5 | 2.4 | 1,500 | 0.80 |
| Comp. Example 8 | E (1) 0.5 | 2.4 | 300 | 0.80 |

| Example No. | Refractive index | Developability | Pattern shape | Transparency |
|---|---|---|---|---|
| 11 | 1.64 | ◯ | ◯ | ◯ |
| 12 | 1.64 | ◯ | ◯ | ◯ |
| 13 | 1.60 | ◯ | ◯ | ◯ |
| 14 | 1.65 | ◯ | ◯ | ◯ |
| Comp. Example 1 | 1.64 | ◯ | ◯ | ◯ |
| Comp. Example 2 | 1.64 | ◯ | X | ◯ |
| Comp. Example 3 | 1.64 | ◯ | ◯ | ◯ |
| Comp. Example 4 | 1.64 | ◯ | X | ◯ |
| Comp. Example 5 | 1.65 | ◯ | ◯ | ◯ |

TABLE 2-continued

| Comp. Example 6 | 1.64 | ○ | X | ○ |
| Comp. Example 7 | 1.64 | X | X | ○ |
| Comp. Example 8 | 1.64 | X | X | △ |

| Example No. | Heat resistance | Solvent resistance | | | | | DOF characteristics | Lens formable temp. (°C.) |
| --- | --- | --- | --- | --- | --- | --- | --- | --- |
| | | A | E | I | D | M | | |
| 11 | ○ | ○ | ○ | ○ | ○ | ○ | ○ | 130–170 |
| 12 | ○ | ○ | ○ | ○ | ○ | ○ | ○ | 130–170 |
| 13 | ○ | ○ | ○ | ○ | ○ | ○ | ○ | 120–160 |
| 14 | ○ | ○ | ○ | ○ | ○ | ○ | ○ | 140–180 |
| Comp. Ex. 1 | X | X | X | X | X | X | △ | 130–150 |
| Comp. Ex. 2 | X | X | X | △ | X | X | △ | — |
| Comp. Ex. 3 | X | X | X | X | X | X | △ | 130–150 |
| Comp. Ex. 4 | ○ | ○ | ○ | ○ | ○ | ○ | ○ | — |
| Comp. Ex. 5 | X | X | △ | △ | X | X | ○ | 130–160 |
| Comp. Ex. 6 | ○ | X | △ | △ | △ | △ | ○ | — |
| Comp. Ex. 7 | ○ | ○ | ○ | ○ | ○ | ○ | △ | — |
| Comp. Ex. 8 | △ | X | △ | △ | △ | △ | X | — |

Note:
Amounts of resin and compounds are all parts by weight as solids.

Explanation of Symbols Used in Tables 1 and 2
Alkali-soluble Resin
A (9): PHM-C manufactured by Maruzen Sekiyukagaku 1,2-Quinonediazide
B (1): Condensate of 1,1,3-tris(2,5-dimethyl-4-hydroxyphenyl)-3-phenylpropane (1 mole) with 1,2-naphthoquinonediazide-5-sulfonic acid chloride (1.9 moles)
B (2): Condensate of 4,4'-[1-[4-[1-[4-hydroxyphenyl]-1-methylethyl]phenyl]ethylidene]-bisphenol (1 mole) with 1,2-napthoquinonediazide-5-sulfonic acid chloride (2.0 moles)
Compound having at least 2 epoxy groups in the molecule
C (1): Epikote 828 (trade name of Yuka Shell Epoxy K.K.)
C (2): Epolite 100MF (trade name of Kyoeisha Yushikagaku Kogyo K. K.)
C (3): Epikote 180S75 (trade name of Yuka Shell Epoxy K. K.)
Melamines represented by formula (1)
D (1): CYMEL 300 (trade name of Mitsui Cyanamide K.K.)
D (2): CYMEL 370 (trade name of Mitusi Cyanamide K.K.)
C (3): CYMEL 303 (trade name of Mitsui Cyanamide K.K.)
Trihalomethyltriazines represented by formula (II) and onium salts represented by formula (III) functioning as a photo-acid-generating agent
E (1): 2-(4-Methoxy-$\beta$-styryl)-bis(4,6-trichloromethyl)-s-triazine
E (2): 2-(4-Methoxynaphthyl)-bis(4,6-trichloromethyl)-s-triazine
E (3): A mixture of 2-(3-chlorophenyl)-bis(4,6-trichloromethyl)-s-triazine with 3-benzoylbenzo[f]coumarin (2:1 by mole)
E (4): Triphenylphosphonium trifluoromethanesulfonate

What is claimed is:
1. A radiation sensitive resin composition for microlens which comprises:
(a) an alkali-soluble resin,
(b) a 1,2-quinonediazide compound,
(c) a compound having at least 2 epoxy groups in the molecule,
(d) a melamine represented by formula (I):

wherein $R^1$ - $R^6$ may be the same as or different from one another and each thereof represents a hydrogen atom or a —$CH_2OR$ group in which R represents a hydrogen atom or an alkyl group having 1 to 6 carbon atoms, and
(e) a trihalomethyltriazine represented by formula (II):

wherein X represents a halogen atom, A represents $CX_3$ or a group represented by one of the following formulas:

wherein each of B, D and E represents a hydrogen atom, an alkyl group having 1–10 carbon atoms, an aryl group having 6–10 carbon atoms, an alkoxy group having 1–10 carbon atoms, an aryloxy group having 6–10 carbon atoms, a thioalkyl group having 1–10 carbon atoms, a thioaryl group having 6–10 carbon atoms, a halogen atom, a cyano group, a nitro group, a tertiary amino group having an alkyl group having 1–10 carbon atoms, a carboxyl group, a hydroxyl group, a ketoalkyl group having 1–10 carbon atoms, a ketoaryl group, an alkoxycarbonyl group having 1–20 carbon atoms or an alkylcarbonyloxy group having 1–20 carbon atoms, and m represents an integer of 1 to 5 or an onium salt represented by formula (III) functioning as a photo-acid-generating agent:

$$(A)_n Z^+ Y^- \qquad (III)$$

wherein A is as defined above, Z represents a sulfur or iodine atom and Y represents $BF_4$, $PF_6$, $SbF_6$, $AsF_6$, p-toluenesulfonate, trifluoromethanesulfonate or trifluoroacetate, and n represents 2 or 3.

2. The composition according to claim 1, wherein the alkali-soluble resin is a homopolymer of an alkali-soluble, radically polymerizable monomer having a phenolic hydroxy group or a carboxyl group, or a copolymer of said alkali-soluble, radically polymerizable monomer with other radically polymerizable monomers.

3. The composition according to claim 1, wherein the alkali-soluble resin is a homopolymer of an alkali-soluble, radically polymerizable monomer having a phenolic hydroxyl group or a copolymer of said alkali-soluble, radically polymerizable monomer with other radically polymerizable monomers.

4. The composition according to claim 1, wherein the alkali-soluble resin is a copolymer of an alkali-soluble, radically polymerizable monomer having a phenolic hydroxyl group and other radically polymerizable monomers in a proportion of 30% by weight or less based on the total weight of the monomers.

5. The composition according to claim 1, wherein the alkali-soluble resin is a homopolymer of an alkali-soluble, radically polymerizable monomer having a carboxyl group or a copolymer of said alkali-soluble, radically polymerizable monomer and other radically polymerizable monomers.

6. The composition according to claim 1, wherein the alkali-soluble resin is a copolymer of an alkali-soluble, radically polymerizable monomer having a carboxyl group with other radically polymerizable monomers in a proportion of 90% by weight or less based on the total weight of the monomers.

7. The composition according to claim 1, wherein the alkali-soluble resin has a polystyrene-reduced weight average molecular weight of 2,000–100,000.

8. The composition according to claim 1, wherein the amount of the 1,2-quinonediazide compound (b) is 5–100 parts by weight per 100 parts by weight of the alkali-soluble resin (a).

9. The composition according to claim 1, which further contains a sensitizer for enhancing the sensitivity of the 1,2-quinonediazide compound (b).

10. The composition according to claim 9, wherein the amount of the sensitizer contained is not more than 100 parts by weight per 100 parts by weight of the alkali-soluble resin (a).

11. The composition according to claim 1, wherein the compound having at least 2 epoxy groups in the molecule (c) is selected from the group consisting of bisphenol A type epoxy resins, bisphenol F type epoxy resins, phenol novolak type epoxy resins, cresol novolak type epoxy resins and aliphatic polyglycidyl ethers.

12. The composition according to claim 1, wherein the amount of the compound having at least 2 epoxy groups in the molecule (c) contained is 1–100 parts by weight per 100 parts by weight of the alkali-soluble resin (a).

13. The composition according to claim 1, wherein the melamine (d) represented by formula (I) is selected from the group consisting of hexamethylolmelamine, hexabutylolmelamine, partially methylolated melamines, alkylated partially methylolated melamines, tetramethylolbenzoguanamine, partially methylolated benzoguanamines and alkylated partially methylolated benzoguanamines.

14. The composition according to claim 1, wherein the amount of the melamine (d) represented by formula (I) contained is 1–100 parts by weight per 100 parts by weight of the alkali-soluble resin (a).

15. The composition according to claim 1, wherein the amount of the trihalomethyltriazine represented by formula (II) or the onium salt represented by formula (III) contained is 0.001–10 parts by weight per 100 parts by weight of the alkali-soluble resin (a).

* * * * *